United States Patent [19]

Watanabe

[11] Patent Number: 4,731,759
[45] Date of Patent: Mar. 15, 1988

[54] INTEGRATED CIRCUIT WITH BUILT-IN INDICATOR OF INTERNAL REPAIR

[75] Inventor: Takayuki Watanabe, Tokyo, Japan

[73] Assignee: NEC Corporation, Tokyo, Japan

[21] Appl. No.: 840,826

[22] Filed: Mar. 18, 1986

[30] Foreign Application Priority Data

Mar. 18, 1985 [JP] Japan .................................. 60-53651

[51] Int. Cl.$^4$ ............................................. G11C 7/00
[52] U.S. Cl. ....................................... 365/200; 365/201
[58] Field of Search ................. 365/200, 201, 96, 103, 365/104, 210; 371/10

[56] References Cited

U.S. PATENT DOCUMENTS 4,281,398  7/1981  McKenny et al. ................... 365/200

FOREIGN PATENT DOCUMENTS 58-125846  7/1983  Japan .................................. 365/200

*Primary Examiner*—Joseph A. Popek
*Attorney, Agent, or Firm*—Sughrue, Mion, Zinn, Macpeak, and Seas

[57] ABSTRACT

A circuit for providing an identification signal indicative of whether or not an semiconductor device has a repaired or replaced portion therein. The circuit is enabled by a control signal which is used for controlling the semiconductor device and causes a change in power supply current flowing into the semiconductor device according to presence or absence of the repaired or replaced portion.

12 Claims, 6 Drawing Figures

INTEGRATED CIRCUIT WITH BUILT-IN INDICATOR OF INTERNAL REPAIR

BACKGROUND OF THE INVENTION

The present invention relates to a semiconductor integrated circuit having redundant portions, and particularly to a semiconductor memory device having a redundant scheme.

Memory capacity of semiconductor memory devices has been remarkably increasing. In accordance with the increase in memory capacity, a number of circuit elements included in each memory chip and an area of each memory chip are increased. Accordingly, the possibility that at least one defective memory cell is present in a memory chip has become large. In order to save such a memory chip having at least one defective memory cell, a redundant scheme has been introduced. According to the redundant scheme, redundant memory cells are fabricated on the same chip on which a normal array of memory cells are formed. In the case where a defective cell or cells are present in the normal array, such defective memory cells are functionally replaced with redundant memory cells. Thus, even the memory chip has defective memory cells in the normal array, the memory chip can utilized as a functionally good one.

In such a semiconductor memory device incorporating a redundant scheme, it is important to know whether or not the redundant scheme is actually used for replacing defects in the normal array, in view of quality and reliability controls. One approach is to provide a read-only memory (ROM) of a fuse type which indicates whether the redundant scheme is actually used to replace defects in the normal array. For example, the U.S. Pat. No. 4,480,199 proposes such technology. According to this U.S. Patent, a voltage switch circuit and a fuse are connected in series between a power voltage terminal (Vcc) and one of external terminals. The fuse is blown-out in the case where the redundant scheme is used, and is maintained conductive when the redundant scheme is not used. The programmed state of the fuse is detected by applying a special voltage outside the normal voltage range for the memory device to the one external terminal thereby to make the voltage switch circuit conductive. Under this condition, when the fuse is kept conductive, a certain amount of current flows from the one of external terminals to the power voltage terminal. On the contrary, in the case where the fuse is blown-out, no current flows between the above two terminals even when the special voltage is applied to the one external terminal.

However, this technique requires the special voltage which is outside the normal voltage range. Therefore, read process of the state of the fuse is relatively difficult. Furthermore, because of the application of the above special voltage to the one external terminal, an internal circuit connected to this one external terminal is likely to be affected by the special voltage and hence there is caused the possibility that an abnormal current flows into the above internal circuit. In the worst case, elements of the internal circuits would be destroyed by the special voltage.

SUMMARY OF THE INVENTION

It is an object of the present invention to provide an improved detection circuit for detecting the utilized state of redundant scheme in a semiconductor device which can operate without necessity of a special voltage outside the normal operating voltage range.

It is another object of the present invention to provide an improved semiconductor memory in which a defective address location can be detected with ease.

The semiconductor device according to the present invention is of the type having first and second voltage terminals, a functional circuit, a control terminal for enabling the functional circuit, and a redundant circuit for repairing a defective portion of the functional circuit if present, and is featured by a detection circuit for indicating whether the redundant circuit is actually used to repair the functional circuit or not. The detection circuit is comprised of a first switch circuit controlled by the potential of the control terminal and a second programmable switch circuit assuming conductive or non-conductive state when the redundant circuit is used and non-conductive or conductive state when the redundant circuit is not used. The first switch circuit and second programmable switching circuit are connected in series between the first and second voltage terminals. The state of the redundant circuit is detected in response to the potential of the control terminal as a change in a power supply current flowing between the first and second voltage terminals.

According to the present invention, there is no necessity of a special voltage outside the normal voltage range, and hence easy and reliable detection can be achieved.

DETAILED DESCRIPTION OF THE INVENTION

Figure 1:
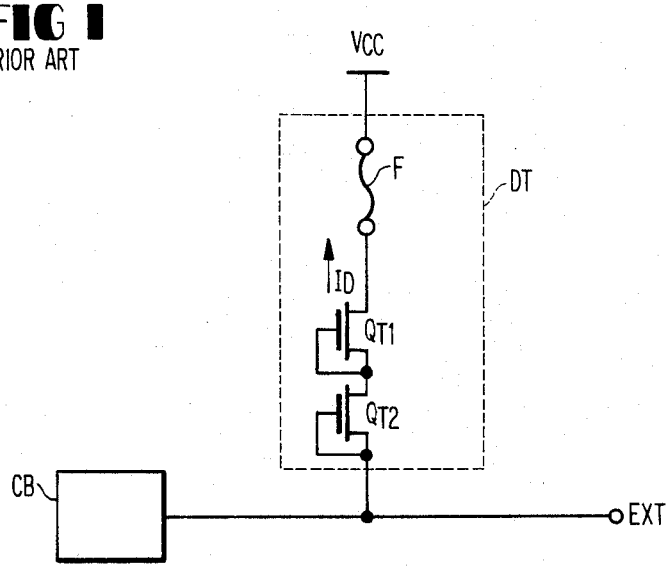
FIG. 1 is a schematic circuit diagram showing a read-only memory for indicating the state of a redundant scheme according to a prior art.

FIG. 1 shows a conventional read-only memory for indicating usage of a redundant scheme.

The read-only memory DT is composed of a fuse F and diode-connected field effect transistors QT1 and QT2 each having a threshold voltage VT which are connected in series between a power voltage terminal Vcc and an external terminal EXT. The terminals Vcc and EXT are originally provided for a memory device in which the read-only memory DT is formed, and the terminal is connected also to an internal circuit CB included in the memory device.

In this arrangement, in the case where a redundant memory cell is used to replace a defective memory cell in a normal memory cell array, the fuse F is blown-out in a known way, while in the case of the redundant memory cell is not used, the fuse F is kept conductive.

This programming of the fuse F is conducted after test of the memory device. In a normal operation, a voltage which is within the normal operation voltage range, i.e. between Vcc and a ground (GND) is applied to the external terminal EXT, and the internal circuit CB performs its function based on the potential at the terminal EXT. In this instance, even when the fuse F is kept conductive, the transistors QT1 and QT2 are maintained non-conductive. Therefore, the read-only memory DT does not affect the state of the external terminal EXT, and the memory device including the circuit CB performs a normal functional operation.

In the case where the state of the fuse F is read out in order to check whether the redundant cell is used to replace a defective cell in the normal array, a higher voltage which is above (Vcc+2V$_T$) is applied to the terminal EXT. Accordingly, in the case where the fuse F is conductive, the transistors QT1 and QT2 are rendered conductive so that a detection current I$_D$ flows from the external terminal EXT to the terminal Vcc through the transistors QT1 and QT2 and the Fuse F. To the contrary, in the case where the fuse F is blown-out, no current flows through the read-only memory section DT irrespective of the application of the higher voltage to the terminal EXT. Thus, the state that the redundant scheme can be detected by the read-only memory DT.

However, in this arrangement, the higher voltage must be applied to the external EXT in order to enable the memory DT and the higher voltage is inevitably applied to the internal circuit CB which operates by the normal voltage range of potential at the same time. Accordingly, in addition to uneasiness of preparing the higher voltage itself, there are caused the possibilities that an abnormal current is caused in the internal circuit CB and break-down or destruction of elements of the internal circuit CB is caused.

Accordingly, this technique of FIG. 1 is not practical.

Figure 2:
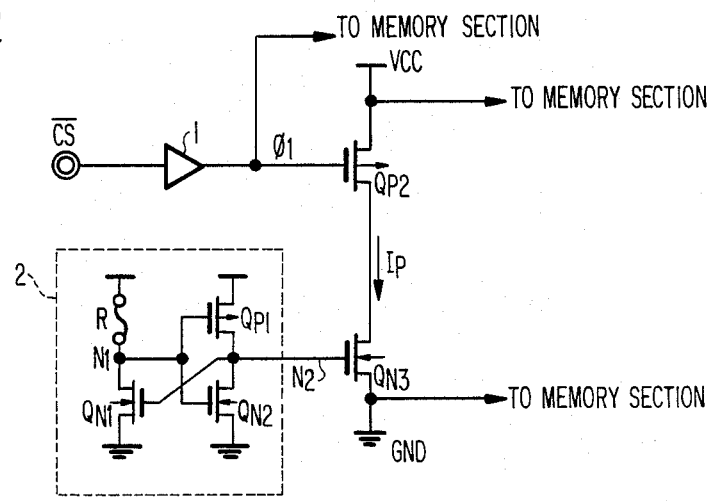
FIG. 2 is a schematic circuit diagram showing a first embodiment of the present invention.

Referring to FIG. 2, an arrangement for indicating the state of the redundant scheme according to a first embodiment of the invention is described.

A p-channel field effect transistor Q$_{P2}$ and an N-channel field effect transistor Q$_{N3}$ are connected in series between the power voltage Vcc and a ground terminal GND of a memory device having a redundant scheme. A chip select signal terminal $\overline{CS}$ receives a chip select signal which is then buffered by a buffer 1 as a control signal $\phi_1$. The control signal $\phi_1$ is applied to a gate of the transistor Q$_{P2}$ as well as being applied to the memory section of the memory device. The memory device is enabled when the signal $\phi_1$, i.e. $\overline{CS}$ is low in level and disenabled when the signal $\phi_1$ ($\overline{CS}$) is high in level. A programmable memory 2 is to indicate whether or not the redundant scheme is actually utilized. The memory 2 is composed of a fusable resistor R made of a polycrystalline silicon film, N-channel field effect transistors Q$_{N1}$ and Q$_{N2}$, and a P-channel field effect transistor Q$_{P1}$. In this memory 2, a resistance of the fusable resistor R is selected to a smaller value than a on-resistance of the transistor Q$_{P1}$ so that a node N$_1$ always takes a high Vcc level and a node N$_2$ takes a low GND level unless the fusable resistor R is cut.

In this arrangement, in the case where the redundant scheme is not used and the normal memory array is completely good the fusable resistor R is not cut. Therefore, the nodes N$_1$ and N$_2$ are set high (Vcc) and low (GND) levels, respectively. Under this condition, when the chip select terminal $\overline{CS}$ is low in level and hence the signal $\phi$ is at low, the memory device is enabled and simultaneously the transistor Q$_{P2}$ is rendered conductive. However, the node N$_2$ is at a low level and the transistor Q$_{N3}$ is not conductive, and therefore no current flows through the transistors Q$_{P2}$ and Q$_{N3}$. While in the case where the redundant scheme is used to replace defective portion of the normal memory array, the fusable resistor R is cut. Therefore, the nodes N$_1$ and N$_2$ of the memory 2 assume low (GND) and high (Vcc) level thereby to render the transistor Q$_{N3}$ conductive.

Accordingly, when the terminal $\overline{CS}$ and the signal $\phi_1$ are at low, the transistor Q$_{P2}$ is rendered conductive with the memory device being enabled. As a result, a detection current I$_D$ flows through the transistors Q$_{P2}$ and Q$_{N3}$ from the terminal Vcc to the ground terminal GND.

In general, a current flowing through the enabled memory device is at a several µA when the memory device is in steady state and at a several mA when a new access cycle is initiated. Therefore, the detection current I$_D$ is easily detected by inserting a current measuring apparatus between the Vcc terminal and a power source of Vcc and by selecting an amount of the detection current I$_D$ at the same value of the above steady state current of the memory device or more. For example, the amount of I$_D$ is selected at 10 µA in view of easy detection and saving of power consumption.

Figure 3:
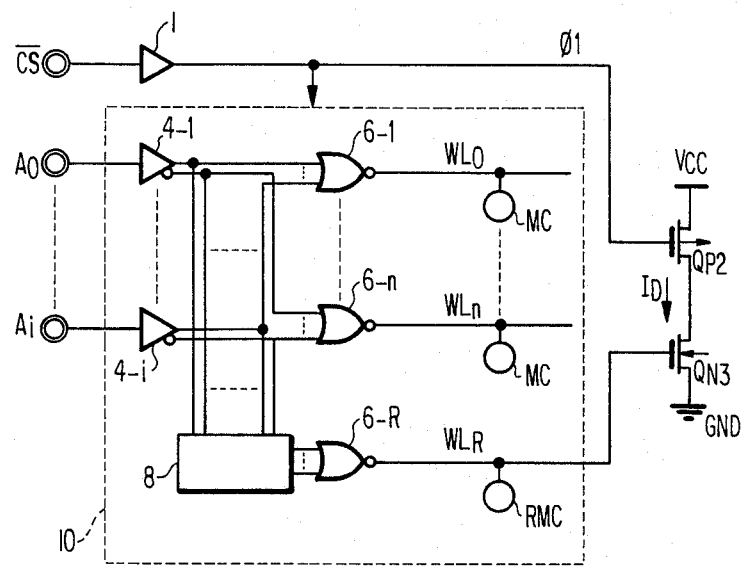
FIG. 3 is a schematic circuit diagram showing a second embodiment of the present invention.

Referring to FIG. 3, a second embodiment of the invention is described. A memory device includes a memory section 10 as well as a detection circuit composed of P-channel transistor and Q$_{P2}$ and N-channel Q$_{N3}$. The memory section 10 includes a plurality of normal array of memory cells MC arranged along a plurality of normal word lines WL0 to WLn. A redundant array of memory cells RMC are arranged along a redundant word line WLR. The word lines WL0 to WLn are driven by NOR type decoders 6-1 to 6-n, respectively. The decoders 6-1 to 6-n receive true and complementary address signals in predetermined combinations which are fed from address buffers 4-1 to 4-i receiving inputs coupled to address terminals A0 to Ai, respectively. The redundant word line RMC is driven by a redundant decoder O-R which is controlled by a redundant address control circuit 8. The address of the defective normal word line coupled to at least one defective memory cell is registered in the control circuit 8.

When the external addresses A0 to Ai designate that defective word line, the control circuit 8 then enables the decoder 6-R thereby to select the redundant word line WLR instead of selecting the defective normal word line. In this arrangement, the redundant word line WLR is connected to the gate of the transistor Q$_{N4}$ instead of the memory 2 of FIG. 2.

When the chip select terminal $\overline{CS}$ and its buffered signal $\phi_1$ are at a low level (GND), the memory section 10 is enabled and the transistor Q$_{P2}$ is rendered conductive. Under this condition, when any one of the normal word lines is selected but the redundant word line WLR is not selected, the transistor Q$_{N4}$ never assumes a conductive state. As a result, no current flows through the transistors Q$_{P2}$ and Q$_{N3}$.

While, when the redundant word line WLR is selected instead of the defective word line, the transistor Q$_{N4}$ is rendered conductive so that the detection current I$_D$ flows via the transistors Q$_{N3}$ and Q$_{P2}$. This detection current is superposed on the operating current of the device flowing from Vcc to the ground.

Accordingly, the selection of the redundant word line is easily detected.

Figure 4:
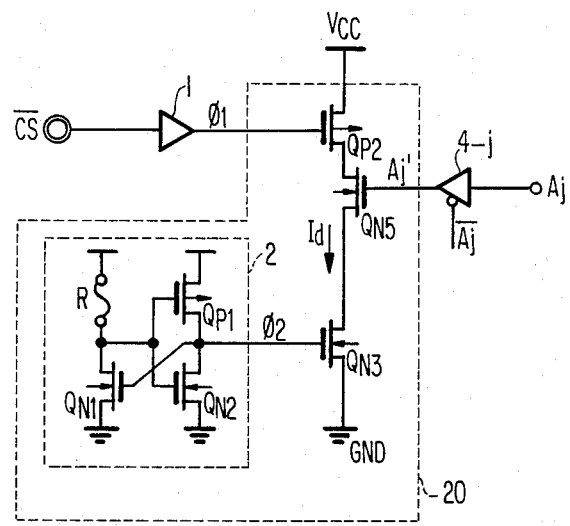
FIG. 4 is a schematic diagram showing a third embodiment of the present invention.

FIG. 4 shows a modified embodiment of FIG. 2, as a third embodiment of the present invention.

This embodiment is achieved by inserting an N-channel field effect transistor Q$_{N5}$ having a gate receiving a true signal Aj' generated by an address buffer 4-j receiving the address input Aj. The address input Aj is not the determinant for selecting the redundant scheme. In other word, the redundant scheme is selected irrespective of the state of Aj.

In this arrangement, when the address input Aj is at a high level, the transistor $Q_{N5}$ is rendered conductive thereby to enable detection of the detection current in addition to the provision explained above for the structure of FIG. 2. The power consumption due to the detection current $I_D$ in the enabled state can be practically reduced because the current $I_D$ is limited to the case of Aj=1.

Figure 5:
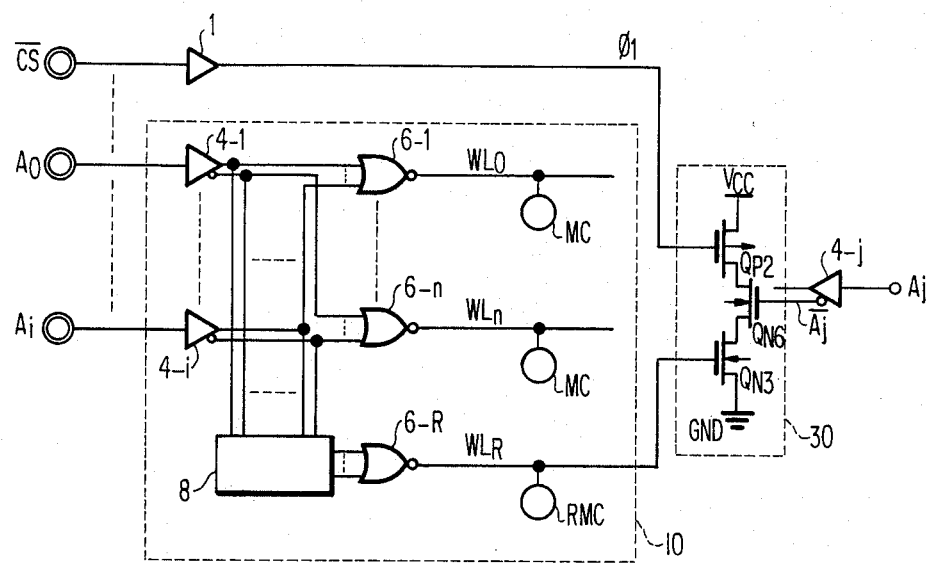
FIG. 5 is a schematic circuit diagram showing a fourth embodiment of the invention.

FIG. 5 shows a modified embodiment of FIG. 3, as a fourth embodiment of the invention. This embodiment is achieved by inserting an N-channel transistor $Q_{N6}$ in series with respect to the transistors $Q_{P3}$ and $Q_{N4}$. The transistor $Q_{N6}$ receives at its gate a complementary signal $\overline{Aj}$ generated from the address buffer 4-j receiving the address input Aj which is not related to the selection of the redundant word line WLR. Accordingly, only when the address input Aj is at low ("0") level and the signal $\overline{Aj}$ is at a high, the detection of the redundant word line's selection is achieved.

Figure 6:
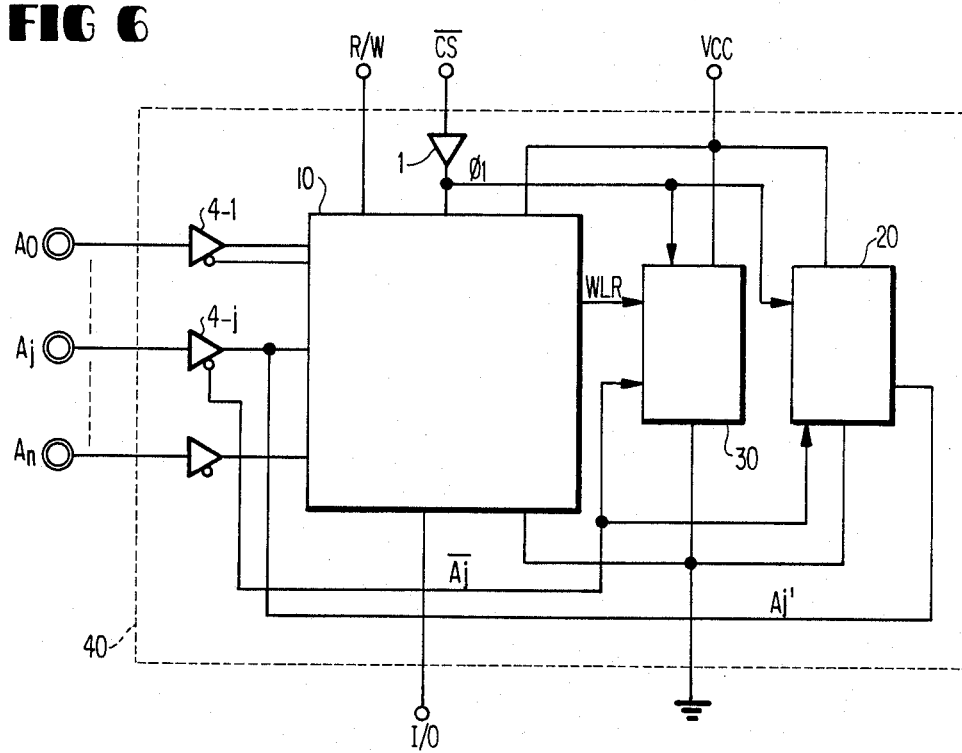
FIG. 6 is a block diagram of the memory device according to the present invention.

FIG. 6 shows a memory device which incorporates the detection circuit 20 of FIG. 4 and the detection circuit 30 of FIG. 5 at the same time. In FIG. 6, the portions corresponding to those in FIGS. 4 and 5 are designated by the same references. The buffered signal $\phi_1$ of the chip select $\overline{CS}$ is commonly applied to the memory section 10, and the detection circuits 20 and 30. The true signal $\overline{Aj}'$ and the complementary signal Aj from the address buffer 4-j are applied to the circuits 20 and 30, respectively. In this arrangement, when the address input Aj is at a high level and the chip select $\overline{CS}$ is at a low level, the detection circuit 20 is enabled to cause a change in a power current by the detection current $I_D$ when the redundant scheme is used to replace the defect in the normal array. In this instance, the detection circuit 30 is disenabled. When the address input Aj is at a low level, the detection circuit 30 is enabled while the circuit 20 is disenabled. Under this condition, the state of the address inputs designated the defective normal word line and therefore the redundant word line is selected internally, the detection current $I_D$ flowing through the circuit 30 is superposed on the current flowing into the Vcc terminal.

According to this arrangement, the presence of the replacing redundant scheme and the address of the defective portion can be detected without doubling the detection current $I_D$.

As has been described above, according to the present invention, any special voltage outside the normal operating voltage range is not necessary, and hence easy and reliable detection of the state of the redundant scheme can be conducted.

I claim:

1. A semiconductor device comprising a first voltage terminal receiving a first potential, a second voltage terminal receiving a second potential, a control terminal for receiving a control signal having first and second logic levels, a functional section coupled to said first voltage terminal, said second voltage terminal and said control terminal, said functional section being enabled when said control signal is at said first logic level, said functional section including at least one normal circuit, a redundant circuit having the same function as said normal circuit and a control circuit, said control circuit being coupled to said normal circuit and said redundant circuit, said control circuit being programmed such that said control circuit operatively enables a normal circuit which is good and enables said redundant circuit when at least one normal circuit is defective to utilize said redundant circuit in place of the defective normal circuit, said control circuit enabling the normal circuit and/or the redundant circuit when said control signal is at said first logic level, a first and a second switching means coupled in series between said first and second voltage terminals, said first switching means being made conductive in response to the first logic level of said control signal and made non-conductive in response to the second logic level of said control signal, said second switching means being made one of conductive or non-conductive when said redundant circuit is enabled in place of said normal circuit and made non-conductive or conductive, being opposite the state representing enabling of said redundant circuit, when said redundant circuit is not utilized, whereby it is detectable through a conductivity between said first and second voltage terminals whether said redundant circuit is utilized or not.

2. The semiconductor device according to claim 1, in which said normal circuit includes a memory circuit having a plurality of memory cells and said redundant circuit includes redundant memory cells.

3. The semiconductor device according to claim 2, in which said second switching means includes a first switch element having a current path connected in series with respect to said first switching means, and means for rendering said first switch element conductive when said at least one of said redundant memory cells is selected.

4. The semiconductor device according to claim 1, further comprising a third switching means connected in series with respect to said first and second switching means, said third switching means being controlled by an external signal.

5. The semiconductor device according to claim 1, in which said second switching means includes a first switch element having current path connected in series with respect to said first switching means, a read-only memory element for storing information representing whether said redundant circuit is utilized or not and means for controlling said first switch element in response to the information stored in said read-only memory element.

6. A semiconductor device comprising a plurality of groups of memory cells, a redundant group of memory cells, means for receiving address information, a control signal terminal receiving a control signal having a first and second logic level, a selection circuit coupled to said plurality of groups of memory cells and said redundant group of memory cells for selecting one group of memory cells in accordance with said address information when said control signal is at said first logic level, said selection circuit selecting said redundant group of memory cells when said address information designates such one of the groups of memory cells that includes at least one defective memory cell, a pair of power voltage terminals for receiving power voltages, a first field effect transistor having a source-drain path and a gate, a second field effect transistor having a source-drain path and a gate, first means for connecting the source-drain paths of said first and second field effect transistors in series between said pair of voltage terminals, second means coupled to the gate of said first field effect transistor for rendering said first field effect transistor conductive when said control signal is at said first logic level and non-conductive when said control signal is at said second logic level, and third means coupled to the gate of said second field effect transistor for rendering said second field effect transistor conductive when at least one defective memory cell is present in said plurality of groups of memory cells and non-conductive when said plurality of groups of memory cells are all good, whereby a current flows between said pair of power voltage terminals via said first and second field effect transistors when at least one defective memory cells is present in said plurality of groups of memory cells.

7. The semiconductor device according to claim 6, in which each group of said plurality of groups and redundant group of memory cells includes a word line to which memory cells included therein are coupled and said selection circuit includes a plurality of decoding units each coupled to a word line of each group of memory cells, and said third means includes means for connecting the word line of said redundant group of memory cells to the gate of said second field effect transistor.

8. The semiconductor device according to claim 6, in which said third means includes a read-only memory element which is programmed to a first state when at least one defective memory cell is present in said plurality of groups of memory cells and a second state when no defective memory cell is present in said plurality of groups of memory cells, and means coupled to said read-only memory element for making said second field effect transistor conductive in response to said first state of said read-only memory element and non-conductive in response to said second state of said read-only memory element.

9. The semiconductor device according to claim 6, said first means includes a third field effect transistor having a source-drain path connected in series with respect to the source-drain paths of said first and second field effect transistors between said pair of power voltage terminals, and means for controlling said third field effect transistor by a part of said address information.

10. A semiconductor device comprising plural groups of memory cells, a redundant group of memory cells, means for receiving address information, a control signal terminal receiving a control signal having first and second logic level, a selection circuit coupled to said plural groups of memory cells and said redundant group of memory cells for selecting one group of memory cells in accordance with said address information when said control signal is at said first logic level, said selection circuit selecting said redundant group of memory cells when said address information designates such one group of memory cells that includes at least one defective memory cells, a pair of power voltage terminals for receiving power voltages, a first field effect transistor having a source-drain path and a gate, a second field effect transistor having a source-drain and a gate, first means for connecting the source-drain paths of said first and second field effect transistors in series between said pair of voltage terminals, second means coupled to the gate of said first field effect transistor for rendering said first field effect transistor conductive when said control signal is at said first logic level and non-conductive when said control signal is at said second logic level, and third means coupled to the gate of said second field effect transistor for rendering said second field effect transistor conductive only when said selection circuit selects said redundant group of memory cells, whereby a current flows between said pair of power voltage terminals via said first and second field effect transistors when a memory cell or cells of said redundant group of memory cells are selected.

11. The semiconductor device according to claim 10, in which each group of said plural groups and redundant group of memory cells includes a word line to which memory cells included therein are coupled and said selection circuit includes a plurality of decoding units each coupled to a word line of each group of memory cells, and said third means includes means for connecting the word line of said redundant group of memory cells to the gate of said second field effect transistor.

12. The semiconductor device according to claim 10, wherein said first means includes a third field effect transistor having a source-drain path connected in series with respect to the source-drain paths of said first and second field effect transistors between said pair of power voltage terminals, and means for controlling said third field effect transistor by a part of said address information.

* * * * *